United States Patent [19]
Shinohara

[11] Patent Number: 5,702,983
[45] Date of Patent: Dec. 30, 1997

[54] METHOD FOR MANUFACTURING A SEMICONDUCTOR DEVICE WITH A METALLIC INTERCONNECTION LAYER

[75] Inventor: Kenji Shinohara, Kanagawa, Japan

[73] Assignee: Sony Corporation, Tokyo, Japan

[21] Appl. No.: 671,952

[22] Filed: Jun. 28, 1996

Related U.S. Application Data

[63] Continuation of Ser. No. 332,736, Nov. 1, 1994, abandoned.

[30] Foreign Application Priority Data

Nov. 2, 1993 [JP] Japan ................... 5-297389

[51] Int. Cl.$^6$ ................................................. H01L 21/44
[52] U.S. Cl. ........................... 437/195; 437/190; 437/192; 437/194
[58] Field of Search .............................. 437/195, 190, 437/192, 194

[56] References Cited

U.S. PATENT DOCUMENTS

| | | | |
|---|---|---|---|
| 4,810,342 | 3/1989 | Inoue | 204/192.17 |
| 4,824,802 | 4/1989 | Brown et al. | |
| 5,147,819 | 9/1992 | Yu et al. | 437/173 |
| 5,250,465 | 10/1993 | Iizuka et al. | 437/173 |
| 5,260,232 | 11/1993 | Muroyama et al. | 437/195 |
| 5,270,254 | 12/1993 | Chen et al. | 437/195 |
| 5,284,799 | 2/1994 | Sato | 437/195 |
| 5,288,665 | 2/1994 | Nulman | 437/195 |
| 5,290,731 | 3/1994 | Sugano et al. | 437/195 |
| 5,312,775 | 5/1994 | Fujii et al. | 437/190 |
| 5,356,836 | 10/1994 | Chen et al. | 437/195 |
| 5,380,680 | 1/1995 | Choi | 437/192 |
| 5,397,742 | 3/1995 | Kim | 437/190 |
| 5,397,744 | 3/1995 | Sumi et al. | 437/200 |
| 5,407,698 | 4/1995 | Emesh | 437/192 |
| 5,407,862 | 4/1995 | Miyamoto | 437/192 |
| 5,418,187 | 5/1995 | Miyanaga et al. | 437/195 |
| 5,427,981 | 6/1995 | Choi | 437/195 |
| 5,470,792 | 11/1995 | Yamada | 437/192 |
| 5,529,953 | 6/1996 | Shoda | 437/192 |
| 5,622,894 | 4/1997 | Jang et al. | 438/643 |

FOREIGN PATENT DOCUMENTS 62-229959  10/1987  Japan.

*Primary Examiner*—Charles L. Bowers, Jr.
*Assistant Examiner*—Lynne A. Gurley
*Attorney, Agent, or Firm*—Hill, Steadman & Simpson

[57] ABSTRACT

A method for manufacturing a semiconductor device having a metallic interconnection layer is described. The method includes the steps of providing a substrate having an insulating film, forming at least one contact hole in the insulating film, forming a first metallic interconnection layer on the insulating film so that the contact hole is filled with the interconnection layer, and forming a second metallic interconnection layer on the first layer to provide a builtup structure. The second layer may be formed by a high temperature sputtering method wherein a substrate temperature is 400° C. or over or by a procedure which includes forming a second metallic interconnection layer by an ordinary sputtering method and heating the substrate to a temperature not lower than 450° C. to cause the second layer to be reflown. By this, the second has a smooth surface irrespective of the presence of irregularities on the surface of the first layer.

6 Claims, 3 Drawing Sheets

METHOD FOR MANUFACTURING A SEMICONDUCTOR DEVICE WITH A METALLIC INTERCONNECTION LAYER

This is a continuation of application Ser. No. 08/332,736, filed Nov. 1, 1994 now abandoned.

BACKGROUND OF THE INVENTION

This invention relates to a method for manufacturing a semiconductor device having a metallic interconnection layer. More particularly, the invention relates to a method for manufacturing a semiconductor device which has a metallic interconnection builtup layer structure including a metallic layer, such as a blanket-W filled in a contact hole and a metallic layer, such as Al, deposited thereof so that the layer structure has good surface smoothness.

For the interconnection in semiconductor devices, there have been hitherto widely used Al materials such as Al, Al—Si and the like which are inexpensive.

On the other hand, semiconductor devices have been recently designed as miniaturized, so that the size of contact holes provided through an insulating layer, such as $SiO_2$, on a substrate becomes small. However, since the insulating layer has little change in its thickness, the aspect ratio of the contact hole inevitably increases.

When, however, the interconnection layer having a large aspect ratio is formed of an Al material alone which has not a good step coverage, the contact hole is apt to undergo conduction failure, thus lowering the reliability of the resultant semiconductor device.

On the other hand, there has been proposed a so-called selective W-CVD method in Japanese Laid-open Patent Application No. 62-229959 which corresponds to U.S. Pat. No. 4,824,802. In the method, $WF_6$ is subjected to reduction reaction to selectively form a W film in the contact hole alone. However, it is difficult to attain complete selectivity according to the selective W-CVD method. In addition, there is the problem that it is not possible principally to simultaneously fill contact holes having different depths.

Moreover, there has also been proposed a so-called blanket W-CVD method (Japanese Laid-open Patent Application No. 62-229959) wherein after formation of contact holes, a W film is deposited over the entire surface of an insulating layer to fill the contact holes therewith, followed by etching the W film to leave the W film only in the contact holes. According to this method, it is possible to fill the contact holes with different depths at the same time.

According to this blanket W-CVD method, a TiON layer may be formed on the $SiO_2$ insulating film as a bonding layer for improving the bonding between the $SiO_2$ insulating film and the W film, followed by filling the W film. Where the W film is formed on the $SiO_2$ insulating film according to the blanket W-CVD method, W which has a high melting point of 338° C. has to be formed as a film at relatively high temperatures. The TiON layer also serves as barrier layer for both $SiO_2$ insulating layer and the W film, thereby inhibiting W from entering into the $SiO_2$ film, ensuring good electric characteristics.

However, even when the contact hole is filled at a good coverage according to the blanket W-CVD method, the specific resistance of the W film is 10 μΩ.cm which is higher than the specific resistance of Al—Si of 2.9 μΩ.cm. Accordingly, where the metallic interconnection layer is formed of the W film alone, the sectional area of the layer has to be increased undesirably.

To solve the above problem, it may occur that a W plug is formed only at a contact portion and a low resistance interconnection layer such as Al—Si is deposited thereon to provide a builtup structure. More particularly, there is considered a method wherein a W film is formed as filling the contact portion according to blanket W-CVD method, the thus formed W film is etched back to form a plug, and a metallic interconnection layer such as of Al—Si is formed on the W plug.

However, this method requires an etching-back step of the W film, thus complicating the formation step of the interconnection layer. In addition, the Ti-based bonding layer formed between the $SiO_2$ insulating film and the W film is also etched back. When a chlorine gas is used for the etching back, the Ti-based bonding layer is etched at a rate higher than the W film, thereby forming a recess at the upper portion of the side walls of the contact hole. Moreover, at the time of the formation of the W film, W deposits from the bottom and the side walls in the inside of the contact hole. The contact hole after completion of the filling has a seam at the central portion thereof established by the contact between the W films grown from the bottom and the side walls. The seamed portion becomes weak in strength. Accordingly, if the W film after completion of the filling is etched back, the seamed portion is more likely to be etched, thereby forming a recess. When the etched-back W film has the recess, the coverage of the interconnection layer formed thereon degrades. Thus, there arises the problem that the reliability of the interconnection layer lowers.

To cope with these problems, we have proposed a method wherein a W film (first metallic layer) is filled in a contact hole according to the blanket W-CVD method, after which the W film is etched back, and an Al interconnection layer (second interconnection layer) is formed. This method is set out in Japanese Patent Application No. 04-326128 which corresponds to U.S. Ser. No. 08/149,946 filed Nov. 10, 1994. The application is assigned to the assignee of the present application and is incorporated herein by reference.

However, in the method wherein the W film is formed according to the blanket W-CVD method, after which an Al-based interconnection layer is formed on the W film without etching back, if the coverage in the contact hole of the W film is improved, irregularities (e.g. approximately 20 nm in the height between the peak and the valley of the irregularities) are undesirably formed on the surfaces of the W film. Accordingly, when the Al-based interconnection layer is formed on the W film, the resultant interconnection layer has its surface emphasized with the irregularities of the W film, thus presenting the problem that the coverage of the Al-based interconnection layer lowers. Moreover, there arises the problem that when an interconnection structure is further formed on the Al-based interconnection layer, many adverse influences are produced. For instance, when the interconnection layer which has not a smooth surface is patterned according to a lithographic method, a desired pattern cannot be formed by the influence of the surface reflection. Moreover, there is another problem that where a contact plug is formed at the interconnection layer, the contact resistance between the contact plug and the interconnection layer increases.

On the other hand, if the CVD conditions are so controlled so that the surface irregularities of the W film are reduced, there arises the problem that the coverage in the contact hole of the W film lowers.

SUMMARY OF THE INVENTION

It is accordingly an object of the invention to provide a method for manufacturing a semiconductor device with a metallic interconnection layer which overcomes the problems involved in the prior art methods.

It is another object of the invention to provide a method for a semiconductor device with a metallic interconnection layer wherein a contact hole is filled with a metallic layer such as of blanket-W on which a metallic layer such as Al is formed to provide an interconnection layer having a builtup structure, the interconnection layer having improved surface smoothness.

We have found that the above objects can be achieved by filling a contact hole with a first metallic interconnection layer such as of blanket-W and forming a second metallic interconnection layer such as of Al is formed on the first layer whereupon the second metallic interconnection layer is heated to not lower than 400° C., i.e. the second metallic interconnection layer may be formed according to a high temperature sputtering method or the substrate is heated after the formation of the second metallic layer by ordinary sputtering is heated to cause the second metallic interconnection film to be reflown thereby forming a final second metallic interconnection layer.

More particularly, the invention provided a method for manufacturing a semiconductor device with a metallic interconnection layer which comprises the steps of:

forming an insulating layer on a substrate;

forming a contact hole in the insulating layer to expose a selected portion of the substrate;

depositing a first metallic interconnection layer to fill the contact hole laterally above the insulating layer; and forming a second metallic interconnection layer on the first metallic interconnection layer while the substrate is heated at a temperature of 400° C. or above.

PREFERRED EMBODIMENTS OF THE INVENTION

Figure 1A:
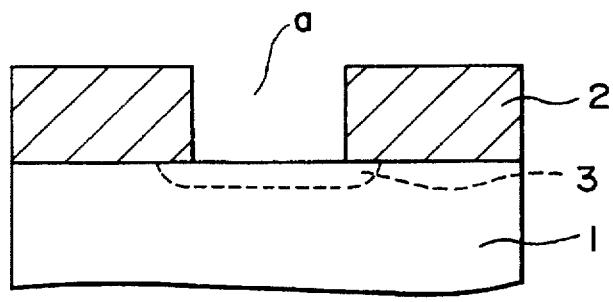
FIGS. 1A to 1C are, respectively, illustrative views showing the respective steps of a method according to one embodiment of the invention.

Reference is now made to the accompanying drawings wherein like reference numerals indicate like parts or members.

FIG. 1 shows a fundamental embodiment of a method for forming a metallic interconnection layer of a semiconductor device. In this embodiment, as shown in FIG. 1A, a substrate 1 having an insulating film 2 is provided and is formed with a contact hole a in the insulating film 2 so that the substrate 1 is exposed. The substrate 1 is not critical and may be a Si substrate formed, for example, with a diffusion layer 3. The insulating film 2 formed on the substrate 1 may be any layer insulting film formed by any ordinary method and is, for example, a $SiO_2$ film formed according to a CVD method. The method for making the contact hole a may be a photolithographic method, like prior art methods.

Figure 1B:
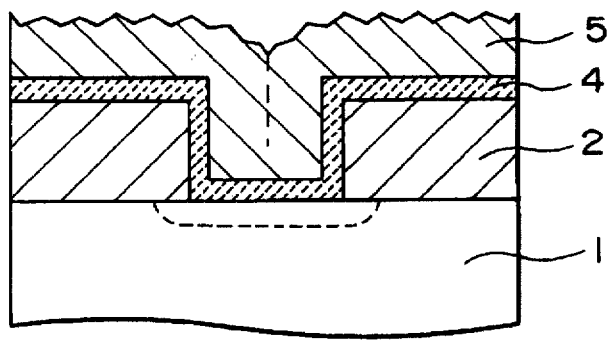

As shown in FIG. 1B, a first metallic interconnection layer 5 is formed on the insulating film to fill the contact hole a therewith. Preferably, a bonding layer 4 is preliminarily formed on the insulating layer 2 so as not only to improve the bonding properties of the first metallic interconnection layer 5, but also to serve as a barrier between the insulating film 2 and the first metallic interconnection layer 5. The first metallic interconnection layer 5 is formed on the bonding layer 4.

The bonding layer 4 should preferably be formed of Ti materials according to sputtering or reactive sputtering. The bonding layer 4 may be constituted of a single layer or of a builtup structure of a plurality of layers. For instance, the bonding layer 4 may have a builtup structure of a Ti layer and a TiON layer.

The first metallic interconnection layer 5 is a metallic layer which is formed of W, Mo, Ti, Pt, Cu or silicides thereof, or an Al metal or alloys according to a CVD method. Of these, it is preferred to form a W film according to a blanket W-CVD method. Where an Al-based metallic layer is formed as the first metallic layer 5 according to the CVD method, the Al-based material used may be an organoaluminum compound such as $(CH_3)_3Al$.

The thus formed first metallic interconnection layer 5 is formed as well filled in the contact hole a, whereupon irregularities are inevitably formed on the surface thereof as shown in FIG. 1B. To avoid this, in the practice of the invention, a second metallic interconnection layer 7 is formed on the first metallic interconnection layer 5, preferably through the bonding layer 6 as will be described hereinafter, by high temperature sputtering wherein the substrate temperature is maintained at 400° C. or over, thereby forming a metallic interconnection layer having a builtup structure of the first and second metallic layers.

Figure 1C:
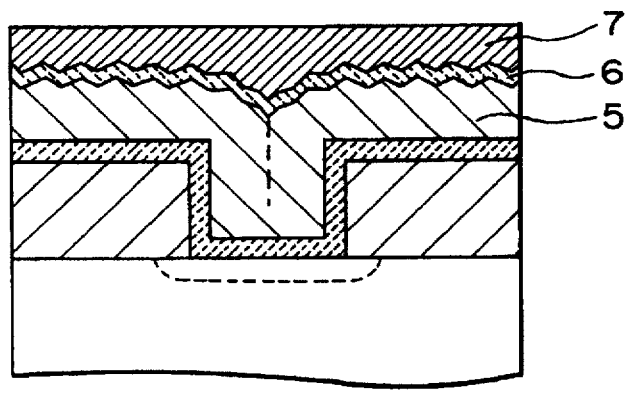

The substrate temperature at the time of the high temperature sputtering for the second metallic interconnection layer may, more or less, depend on the type of metal for the second metallic interconnection layer 7 and is preferably in the range of from 400° to 600° C., more preferably from 450° to 500° C. In this manner, when the second metallic layer 7 is formed according to the high temperature sputtering wherein the substrate temperature is higher than under ordinary sputtering conditions, the second metallic layer 7 can be formed as having a smooth surface as shown in FIG. 1C. When the substrate temperature at the time of sputtering is 300° C. or below, the second metallic layer 7 does not become smooth on the surface thereof in a satisfactory manner. Over 600° C., surface roughness inherent to the high temperature sputtering takes place in the second metallic layer 7.

Alternatively, the surface smoothness may be attained using, in place of the high temperature sputtering, a procedure wherein the second metallic interconnection layer is formed at an ordinary substrate temperature and then, the substrate temperature is raised to 450° C. or higher thereby causing the second metallic layer to be reflown on the substrate. According to this procedure, the substrate temperature at which the second metallic interconnection layer is formed can be made lower than that of the high temperature sputtering, making it possible to form the second metallic layer having better surface smoothness.

Where the second metallic layer is reflown after the formation of the layer, the substrate temperature at the time of reflowing should preferably be within a range of 450° to 500° C. When the substrate temperature is lower than 450° C., reflow does not proceed satisfactorily. On the contrary, when the substrate temperature exceeds 600° C., the second metallic layer melts with some possibility that the smoothness may lower.

It will be noted that when the contact hole a is filled with an Al-based metal or alloy such as Al—Si according to the high temperature sputtering without filling with the first metallic interconnection layer 5 such as a W film, the substrate temperature at the time of sputtering should be heated to approximately 500° C. In this connection, according to this embodiment of the invention, since the contact hole a has been already filled with the first metallic interconnection layer 5 prior to the formation of the second metallic layer 7, the second metallic layer 7 is expected only to smooth the surface irregularities of the preliminarily formed first metallic layer 5 such as a W film. Accordingly, the substrate temperature at the time of the high temperature sputtering or reflowing may be at 400° C. or over which is lower than a substrate temperature required for filling the contact hole a by the high sputtering temperature, i.e. approximately 500° C. Thus, since the high sputtering can be performed at a substrate temperature which is lower than in the case of high temperature sputtering for filling the contact hole a directly with an Al-based metal or alloy, the thermal history of the substrate can be mitigated, not necessitating any specific barrier metal structure.

The second metallic layer formed by the high temperature sputtering or reflowing should preferably be made of Al or Al alloys containing at least one of Si, Cu and Ti.

It is preferred that prior to the formation of the second metallic layer 7, the bonding layer 6 consisting of Ti, TiON, TiN or TiW is formed on the first metallic layer 5. By this, it becomes possible to improve the adhesion or bonding between the first and second metallic interconnection layers 5 and 7.

The metallic interconnection layer thus formed can be patterned using photolithographic techniques, like known interconnection layers. The metallic interconnection layer formed by the method of the invention may be built up with other insulating layer or interconnection layer. As a matter of course, a contact plug may be formed in association with the interconnection layer.

Figure 2:
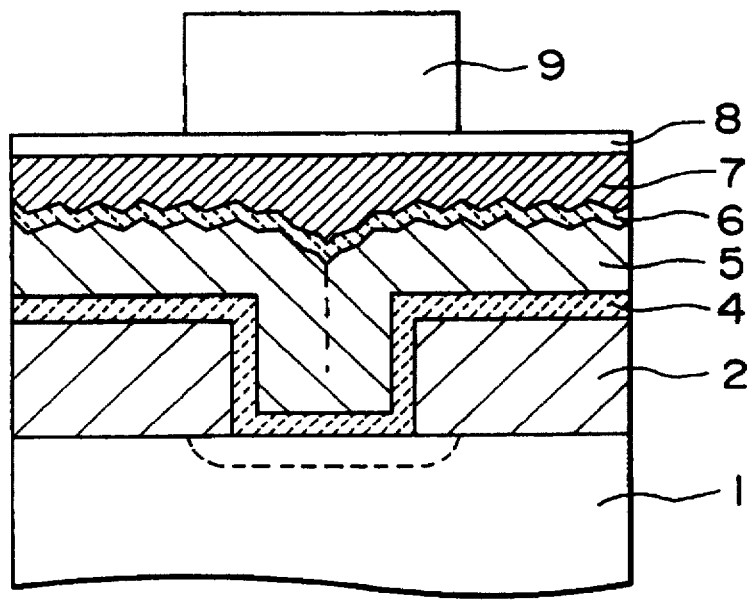
FIG. 2 is a sectional view showing a metallic interconnection layer formed according to the method of the invention, on which a resist film is subjected to patterning.

For instance, as shown in FIG. 2, an antireflection film 8 may be formed on the second metallic interconnection layer 7, on which a resist film 9 is formed, followed by patterning of the photoresist by photolithography. In the case, the since the second metallic layer is smooth on the surface thereof, the resist film 9 may be patterned in high accuracy.

Figure 3:
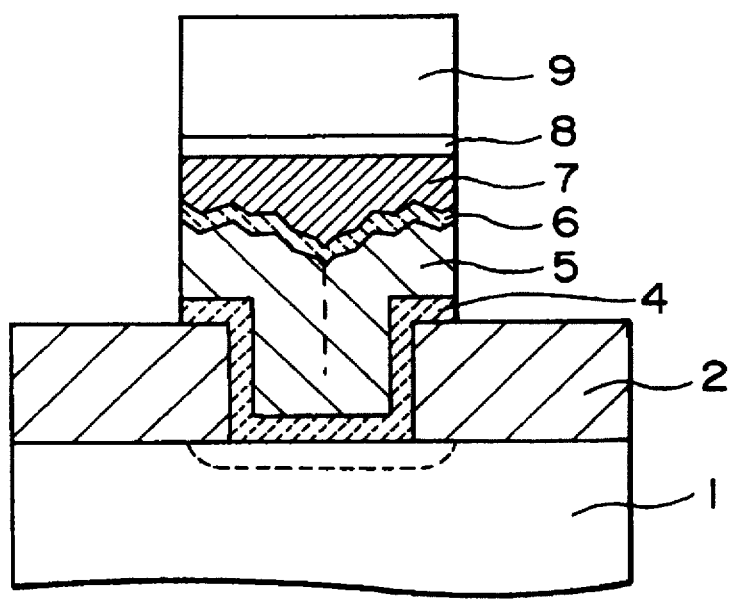
FIG. 3 is a sectional view showing patterning of a metallic interconnection layer formed according to the method of the invention.

When etched after the patterning of the resist film 9, the metallic interconnection layer can be formed in a desired pattern as shown in FIG. 3. The apparatus used to form the pattern as set out above is not critical, any apparatuses which are ordinarily used for fabricating metallic interconnection layers may be used in the practice of the invention. For instance, there may be used microwave plasma etching devices, parallel plane plate etching devices and magnetron RIE devices.

As will be apparent from the foregoing, according to the invention, a first metallic interconnection layer is filled in a contact hole of an insulating film formed on a substrate and a second metallic interconnection layer formed on the first layer to provide a metallic interconnection layer of a builtup structure, whereupon the substrate temperature at the time of forming the second metallic layer is maintained at 400° C.

or over. Alternatively, the second metallic layer may be formed by an ordinary sputtering method, after which the substrate is heated to cause the second metallic layer to be reflown. By this, even if the first metallic film has irregularities on the surface thereof, the second metallic layer is formed as having a smooth surface.

The present invention is more particularly described by way of examples.

EXAMPLE 1

(i) Formation of a metallic interconnection layer

According to the procedure illustrated in FIGS. 1A to 1C, a metallic interconnection layer was formed.

A Si substrate 1 formed with a diffusion layer 3 was formed thereon with an insulating layer 2 made of a $SiO_2$ film according to an ordinary CVD method. A resist film was subsequently applied onto the $SiO_2$ film and patterned according to photolithography. The insulating film 2 was subjected to a RIE device using the patterned resist film as a mask under the following conditions A to make a contact hole a (FIG. 1A).

[Conditions A]

$O_2/CHF_3$=8/75 sccm

Pressure=50 mtorr.

High frequency power=1000 W

Thereafter, a Ti layer and a TiON layer were successively deposited, as a bonding layer 4, on the entire surface of the insulating film 2, followed by further deposition of a first metallic interconnection layer 5 on the bonding layer 4 using a cold wall-type CVD apparatus under the following conditions B.

[Conditions B]

$H_2/WF_6$ (gas ratio)=1/19

Reaction temperature=400° C.

Reaction pressure=6.5 torr.

Thus, a W film 5 was formed in a thickness of not less than 50% of the diameter of the contact hole a. The W film 5 at the contact hole had a good coverage but was formed on the surface thereof with irregularities having a peak-to-valley height of about 200 nm (FIG. 1B).

The, using a commercially available magnetron sputtering apparatus, a Ti layer was formed on the W film as a bonding layer 6 under the following conditions C (step 1), followed by raising a substrate temperature to form an Al—Si alloy film containing 1% of Si as a second metallic interconnection layer 7 (step 2) thereby forming a metallic interconnection layer of the invention (FIG. 1C).

[Conditions C]

First step

Ar gas pressure=2 mtorr.

Sputtering power=15 kW

Substrate temperature=200° C.

Sputtering time=4 seconds

Second step

Ar gas pressure=2 mtorr.

Sputtering power=7.5 kW

Substrate temperature=400° C.

Sputtering time=40 seconds

The thus formed Al—Si film 7 had a smooth surface in spite of the irregular surface of the W film 5.

(ii) Patterning of the metallic interconnection layer

A TiON film was formed on the Al—Si interconnection layer 7 formed in (i) as an antireflection film 8 according to a reactive sputtering method using an $O_2/N_2$ gas, followed by formation of a resist film 9 and patterning of the resist film 9 according to photolithography. As a result, the resist film could be patterned in high accuracy.

Subsequently, using the pattern of the resist film 9 as a mask, the interconnection layer was etched by use of a microwave plasma etching apparatus under the following conditions D.

[Conditions D]

$BCl_3/Cl_2=60/90$ sccm

Pressure=1.1 Pa (8 mtorr.)

Microwave current=300 mA

Substrate bias=40 W

Under these etching conditions, the TiON film 8, Al—Si film 7 and Ti layer 6 are etched by means of the plasma of the chlorine gas. However, when the etching process to such an extent the W film is exposed, tungsten chloride is formed. This tungsten chloride is so low in vapor pressure that etching scarcely proceeds. Therefore, when the W film was exposed, the etching conditions were changed to the following conditions E wherein discharge was effected in a mixed gas of fluorine and chlorine gases.

[Conditions E]

$SF_6/Cl_2=80/40$ sccm

Pressure=1.1 Pa (8 mtorr.)

Microwave current=300 mA

Substrate bias=30 W

Under these conditions using the mixed gas, tungsten fluoride was formed during the course of etching. The tungsten fluoride was so high in vapor pressure that the etching of the W film 5 proceeded readily. Moreover, during the etching, there were also formed tungsten chlorides, such as $WCl_5$, $WCl_6$ and the like, by reaction between chlorine radicals and the W film. These tungsten chlorides are removed by the sputtering reaction based on the incident ions at the bottom plane for etching. On the other hand, at the side walls for the etching plane, the tungsten chlorides serve as a kind of protective film for the side walls and prevent the side attack reaction of the fluorine radicals. Accordingly, the W film could be anisotropically processed under these etching conditions. By the etching, the bonding layer 4 serving as an underlying layer for the W film 5 could also be etched out. After exposure of the $SiO_2$ insulating film 2 by removal of the W film 5 and the bonding layer 4, the etching conditions may be changed to the conditions D using no fluorine gas in order to improve the selectivity to the $SiO_2$ insulating film 2.

As a results, the metallic interconnection layer could be patterned as shown in FIG. 3.

EXAMPLE 2

In the same manner as in Example 1, a $SiO_2$ insulting film 2 was formed in a Si substrate 1 having a diffusion layer 3, followed by making a contact hole a, forming a bonding layer 4 and forming a W film 5.

Figure 4A:
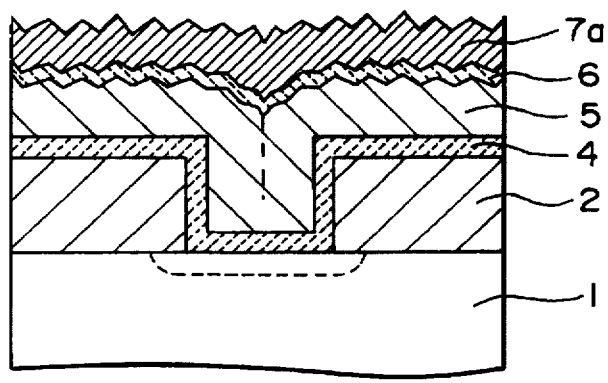
FIGS. 4A and 4B are, respectively, illustrative views showing the respective manufacturing steps according to another embodiment of the invention.

Thereafter, a Ti layer and an Al—Si film 7a were formed according to an ordinary magnetron sputtering at a substrate temperature of 200° C. As a result, the surface of the Al—Si film became irregular in a more pronounced form of the irregularities of the W film as shown in FIG. 4A.

Figure 4B:
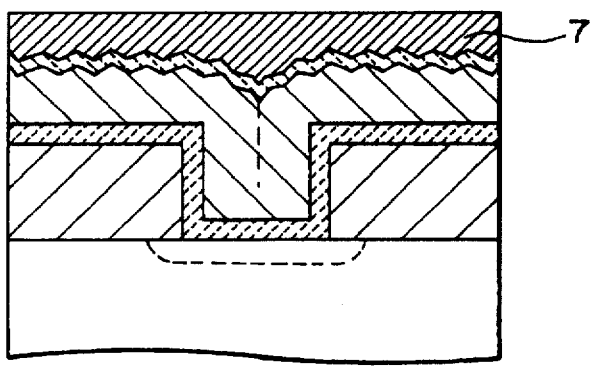

Next, while keeping the sputtering apparatus under a reduced pressure, the substrate temperature was raised to 500° C. over 90 seconds. By this, the Al—Si film 7a was reflown to obtain an Al—Si film whose surface was smoothed irrespective of the surface irregularities of the W film (FIG.4B).

Thereafter, the procedure of Example 1 (ii) was repeated to pattern the resultant metallic interconnection layer.

Comparative Example 1

The general procedure of Example 1 was repeated except that the Al—Si film 7 was formed according to a conventional sputtering method without use of the high temperature sputtering, thereby forming a metallic interconnection layer and that a resist film 9 was patterned on the interconnection layer.

Figure 5:
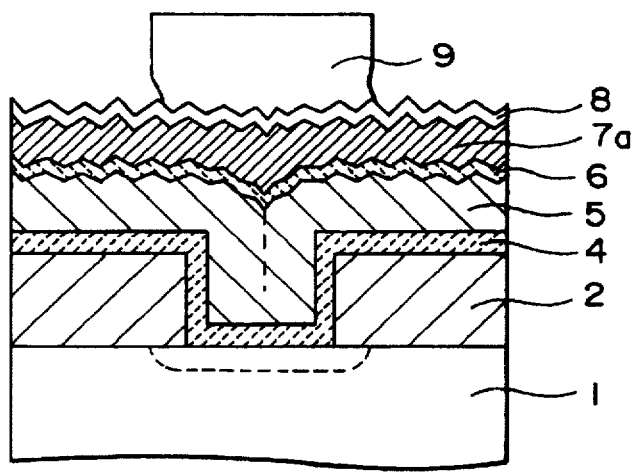
FIG. 5 is a sectional view showing a resist film patterned on a metallic interconnection layer formed by a prior art method.

As a result, as shown in FIG. 5, the Al—Si film 7a had irregularities in a more pronounced form of the surface irregularities of the W film. The side walls of the patterned resist film 9 were toughened by the influence of the irregular reflection at the time of exposure to light.

What is claimed is:

1. A method for manufacturing a semiconductor device with a built-up metallic interconnection layer comprising the steps of:

providing a substrate with a surface;

forming an insulating layer on the surface;

forming a contact hole having a diameter in the insulating layer to expose a selected portion of the substrate;

forming a first bonding layer on the insulating layer and contact hole;

forming a tungsten interconnection layer on the first bonding layer having a thickness not less than 50% of the diameter of the contact hole and completely filling the contact hole;

forming a second bonding layer on the tungsten interconnection layer without etching back the tungsten interconnection layer;

forming a metallic interconnection layer selected from aluminum and alloys of aluminum with at least one of Si, Cu and Ti on the second bonding layer to form a built-up interconnection layer; and subjecting the built-up interconnection layer to elevated temperatures of from about 400° C. to about 500° C. under a reduced pressure less than atmospheric pressure for a time sufficient to reflow the metallic interconnection layer without melting the metallic interconnection layer to provide a built-up interconnection layer having a smooth surface.

2. A method according to claim 1, wherein said temperature is within a range of from 450° C. to 500° C.

3. A method according to claim 1, wherein said tungsten interconnection layer is formed by a CVD method.

4. A method according to claim 1, wherein said first and second bonding layers include a single layer or a plurality of layers made of a Ti material.

5. A method according to claim 1, wherein said second bonding layer is selected from the group consisting of Ti, TiON, TiN and TiW.

6. A method as defined in claim 1, wherein the subjecting step is performed during the forming of the metallic interconnection layer.

* * * * *